(12) United States Patent  
Chung

(10) Patent No.: US 8,422,308 B2  
(45) Date of Patent: Apr. 16, 2013

(54) BLOCK DECODER OF FLASH MEMORY DEVICE

(75) Inventor: Sang Hwa Chung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 593 days.

(21) Appl. No.: 12/646,738

(22) Filed: Dec. 23, 2009

(65) Prior Publication Data

US 2010/0182835 A1 Jul. 22, 2010

(30) Foreign Application Priority Data

Jan. 22, 2009 (KR) .................. 10-2009-0005420

(51) Int. Cl.
*G11C 16/10* (2006.01)
(52) U.S. Cl.
USPC .............. 365/185.25; 365/185.11; 365/203
(58) Field of Classification Search ............. 365/185.11, 365/185.25, 203
See application file for complete search history.

(56) References Cited

U.S. PATENT DOCUMENTS 7,180,786 B2 * 2/2007 Mastrangelo et al. ... 365/185.23
8,085,616 B2 * 12/2011 Ryu ......................... 365/230.06

FOREIGN PATENT DOCUMENTS

| KR | 1020050079533 | 8/2005 |
| KR | 1020060104834 | 10/2006 |
| KR | 1020070068005 | 6/2007 |

OTHER PUBLICATIONS

Notice of Allowance issued from Korean Intellectual Property Office on Feb. 21, 2011.

* cited by examiner

*Primary Examiner* — Anthan Tran
(74) *Attorney, Agent, or Firm* — IP & T Group LLP

(57) ABSTRACT

A block decoder of a flash memory device includes a discharge control unit configured to output a discharge signal in response to a program precharge signal and one or more of a number of address signals, and a selection line control unit configured to apply a ground voltage to source and drain selection lines of memory blocks in response to the discharge signal.

11 Claims, 4 Drawing Sheets

BLOCK DECODER OF FLASH MEMORY DEVICE

CROSS-REFERENCE TO RELATED APPLICATION

Priority to Korean patent application number 10-2009-0005420 filed on Jan. 22, 2009, the entire disclosure of which is incorporated by reference herein, is claimed.

BACKGROUND

An embodiment relates to the block decoder of a flash memory device and, more particularly, to the block decoder of a flash memory device which is capable of preventing charges from flowing into the channel of an unselected memory block.

Recently, there is an increasing demand for nonvolatile memory devices, which can be electrically programmed and erased, and do not require the refresh function of rewriting data at specific intervals. To develop high-capacity memory devices capable of storing a large amount of data, research is being done on technologies for the high integration of memory devices. Accordingly, active research is being done on flash memory.

Flash memory is mainly classified into NAND-type flash memory and NOR-type flash memory. The NOR-type flash memory has an excellent random access time characteristic because it has memory cells each independently coupled with a bit line and a word line. The NAND-type flash memory is excellent in terms of the degree of integration because it has a plurality of memory cells coupled together in series and so requires only one contact per cell string. For such a reason, the NAND-type structure is mainly used in high-integration flash memory.

In general, a flash memory device requires a block decoder for selecting a memory cell array on a block basis in order to perform program, read, and erase operations for a memory cell.

FIG. 1 is a circuit diagram of a flash memory device illustrating a conventional block decoder, and FIG. 2 shows waveforms of operation signals for controlling an unselected memory block of the conventional block decoder.

The operation of the block decoder for controlling an unselected memory block is described below with reference to FIGS. 1 and 2.

First, a NAND gate ND1 is configured to logically combine pre-decoded address signals XA, XB, XC, and XD and to output a first output signal ADD. A NAND gate ND2 is configured to logically combine the first output signal ADD and a program precharge signal PGMPREb and to output a second output signal CON. Accordingly, when at least one of the address signals XA, XB, XC, and XD is in a low level, the NAND gate ND1 outputs the first output signal ADD of a high level. When at least one of the program precharge signal PGMPREb and the first output signal ADD of the NAND gate ND1 is in a low level, the NAND gate ND2 outputs the second output signal CON of a high level. Here, the address signals XA, XB, XC, and XD correspond to an unselected memory block, and so at least one of the address signals XA, XB, XC, and XD is applied at a low level (e.g., the address signal XA can be applied with a low level). Accordingly, the first output signal ADD of a high level is generated, and the second output signal CON of a high level is generated for a certain period of time in response to the first output signal ADD of a high level and the program precharge signal PGMPREb of a low level. Thus, a NAND gate ND3 generates a third output signal DIS of a low level for a certain period of time in response to the second output signal CON of a high level and an enable signal EN of a high level. Consequently, a discharge unit 40 is in a disable state.

The certain period of time in which the third output signal DIS of a low level is generated is a period in which the output node Q1 of all block decoders of a selected memory block and an unselected memory block is precharged. If the third output signal DIS is applied at a high level during this period, the output node Q1 drops to a ground path, and so a program operation on the selected memory cell block is not properly performed.

Accordingly, the program precharge signal PGMPREb of a low level is applied for the certain period of time in order to secure the precharge period.

However, the program precharge signal PGMPREb of a low level is a global signal, and so it is applied to the block decoders of not only the selected memory block, but also the unselected memory block. Accordingly, the discharge unit 40 makes the source selection line and the drain selection line of the unselected memory block a floating state. If the source selection line and the drain selection line of the unselected memory block become a floating state, a bit line and a common source line rise to a power source voltage (Vcc) level. Accordingly, the source selection line and the drain selection line are boosted and raised to the power source voltage (Vcc) level. Consequently, charges of the bit line and the common source line flow into a cell channel. In this case, when a verification operation starts after the program operation for the selected memory block is finished, the charge flow lowers a voltage of the word line of all the unselected memory blocks to a negative (−) voltage through the coupling effect between the bit line and the word line, and causes the bias of a global word line to flow into the word line of the unselected memory blocks, thereby generating a bias drop phenomenon. Accordingly, the program operation for the selected memory block is not properly performed, resulting in a failed program operation.

BRIEF SUMMARY

An embodiment relates to the block decoder of a flash memory device, which is configured to control a selection line control unit configured to apply a ground voltage to a source selection line and a drain selection line of a memory block using a program precharge signal and address signals. Thus, the block decoder is capable of preventing the selection line control unit, corresponding to an unselected memory block, from being disabled, and therefore, prevents the source selection line and the drain selection line of the unselected memory block from obtaining a floating state.

The block decoder of a flash memory device according to an aspect of this disclosure includes a discharge control unit configured to output a discharge signal in response to a program precharge signal and one or more of a number of address signals, and a selection line control unit configured to apply a ground voltage to source and drain selection lines of memory blocks in response to the discharge signal.

The discharge control unit is configured to disable the selection line control unit during a precharge period when the one or more of the address signals are enabled, and to enable the selection line control unit during a program or verification operation period.

The selection line control unit includes a selection line control unit configured to apply the ground voltage to the source and drain selection lines of unselected memory blocks of the memory blocks during the program or verification operation period.

The block decoder further includes a decoding unit configured to output a decoding signal to the discharge control unit in response to the number of the address signals.

The block decoder further includes a selection signal generation unit configured to output a block selection signal in response to one or more high voltage address signals respectively corresponding to the one or more address signals, and a discharge unit configured to discharge an output terminal of the selection signal generation unit.

The discharge control unit includes a control signal generation unit configured to generate a control signal in response to the program precharge signal and the one or more address signals, and a discharge signal generation unit configured to generate the discharge signal in response to the control signal.

The decoding unit includes a power source supply unit configured to apply a power source voltage to a first node, and a decoding signal output unit configured to change a potential of the first node in response to the number of the address signals and to output the decoding signal.

The discharge unit is configured to control the block selection signal in response to the decoding signal or the discharge signal.

DESCRIPTION OF EMBODIMENT

Hereinafter, an embodiment of the present disclosure will be described in detail with reference to the accompanying drawings. The figures are provided to allow those having ordinary skill in the art to understand the scope of the embodiment of the disclosure.

Figure 1:
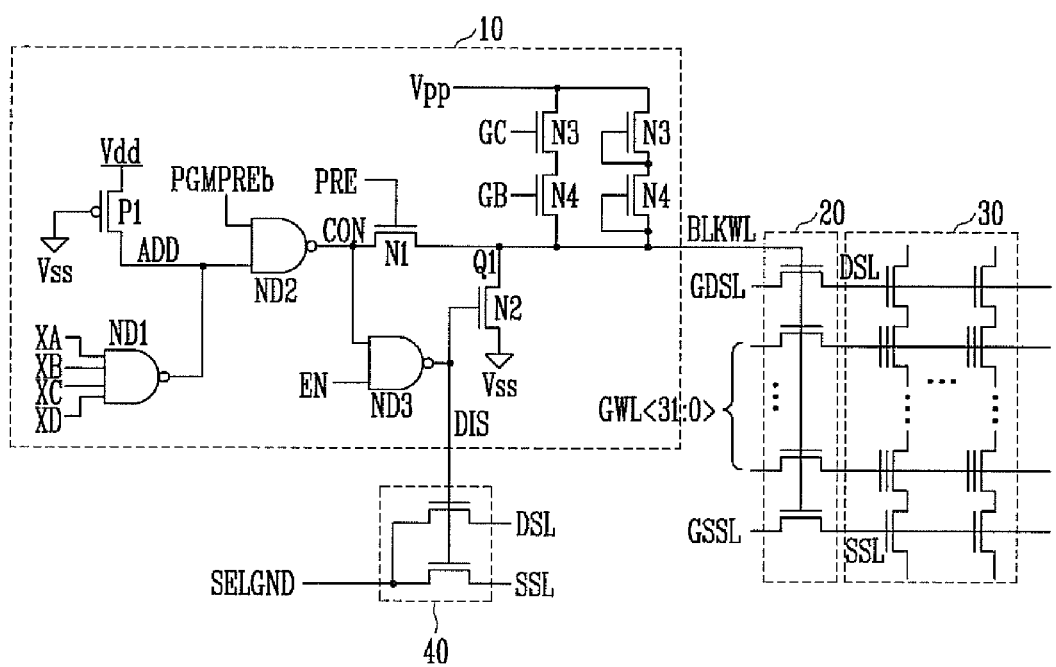
FIG. 1 is a circuit diagram of a flash memory device illustrating a conventional block decoder.
Figure 2:
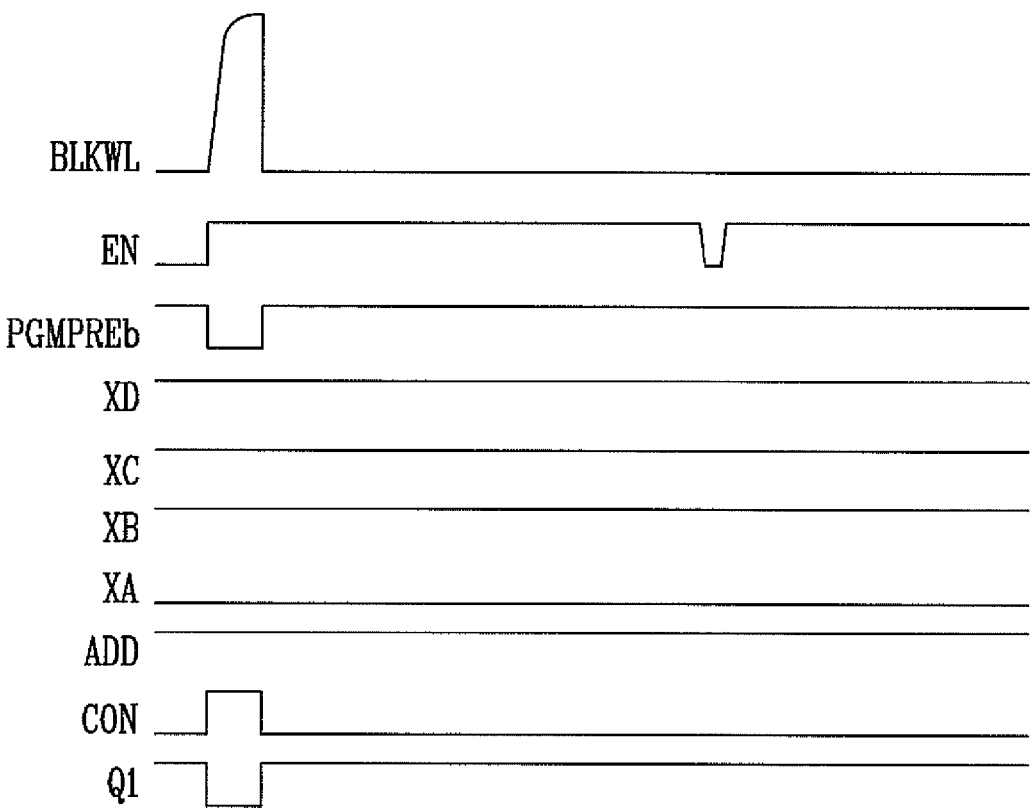
FIG. 2 shows waveforms of operation signals for controlling an unselected memory block of the conventional block decoder of FIG. 1.
Figure 3:
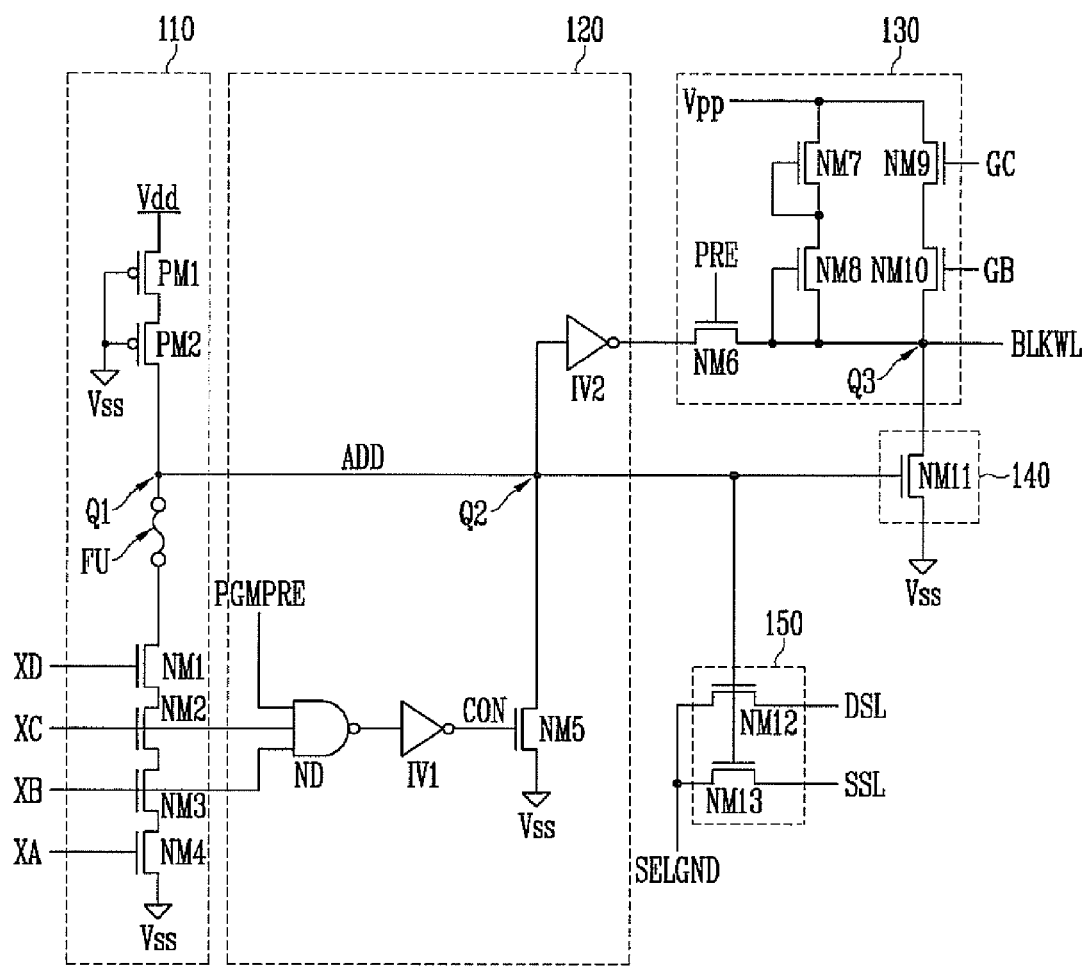
FIG. 3 is a circuit diagram of a block decoder according to an embodiment of this disclosure.

FIG. 3 is a circuit diagram of a block decoder 100 according to an embodiment of this disclosure.

Referring to FIG. 3, the block decoder 100 includes a decoding unit 110, a discharge control unit 120, a selection signal generation unit 130, a discharge unit 140, and a selection line control unit 150.

The decoding unit 110 includes PMOS transistors PM1 and PM2, NMOS transistors NM1 to NM4, and a fuse Fu. The PMOS transistors PM1 and PM2 are coupled in series between a first node Q1 and a power source voltage (Vdd). The PMOS transistors PM1 and PM2 are configured to have gates coupled with a ground voltage (Vss) and to supply the first node Q1 with the power source voltage (Vdd). The fuse Fu and the NMOS transistors NM1 to NM4 are coupled in series between the first node Q1 and the ground voltage (Vss). When a corresponding memory block is a bad block, the fuse Fu is cut such that a block selection signal BLKWL that is finally outputted is in a low level. Pre-decoded address signals XD, XC, XB, and XA are respectively applied to the gates of the NMOS transistors NM1 to NM4. Accordingly, when all the address signals XD, XC, XB, and XA are enabled, the first node Q1 is set to a low level, and so a decoding signal ADD of a low level is outputted. When at least one of the address signals XD, XC, XB, and XA is disabled, the first node Q1 remains in a high level, and so the decoding signal ADD of a high level is outputted. In general, in a memory device having a 2K memory block, the address signals XD, XC, XB, and XA are digital data signals XD<7:0>, XC<7:0>, XB<7:0>, and XA<3:0>, respectively.

The discharge control unit 120 includes a NAND gate ND, inverters IV1, IV2, and a NMOS transistor NM5. The NAND gate ND is configured to logically combine a program precharge signal PGMPRE and some (e.g., XB and XC) of the address signals XD, XC, XB, and XA. The inverter IV1 is configured to invert the output signal of the NAND gate ND and outputs the result as a control signal CON. The NMOS transistor NM5 is coupled between a ground voltage (Vss) and a second node Q2 configured to receive the decoding signal ADD and is configured to discharge or maintain the potential of the second node Q2 in response to the control signal CON. The inverter IV2 is configured to invert the potential of the second node Q2, and to output the result to the selection signal generation unit 130.

The selection signal generation unit 130 includes a number of NMOS transistors NM6 to NM10. The NMOS transistor NM6 is configured to transmit the output signal of the discharge control unit 120 to a third node Q3 in response to a control signal PRE. The NMOS transistor NM7 is diode-coupled with the drain of the NMOS transistor NM8 in a reverse direction, and the NMOS transistor NM8 is diode-coupled with the third node Q3 in a reverse direction. The drains of the NMOS transistors N7, N9 are coupled with a pumping voltage (Vpp). When a voltage level of the third node Q3 rises to more than a predetermined voltage level, the NMOS transistors NM7 and NM5 clamp the pumping voltage (Vpp), such that the voltage level of the third node Q3 maintains the predetermined voltage level.

The NMOS transistor NM9 and the NMOS transistor NM10 are coupled in series between the pumping voltage (Vpp) and the third node Q3. The NMOS transistor NM9 and the NMOS transistor NM10 are configured to precharge the third node Q3 with the pumping voltage (Vpp) in response to first and second high voltage address signals GC and GB, respectively, and output the block selection signal BLKWL having a high voltage. The first and second high voltage address signals GC and GB preferably are high voltage address signals corresponding to some of the address signals XD, XC, XB, and XA applied to the discharge control unit 120.

The discharge unit 140 includes an NMOS transistor NM11. The NMOS transistor NM11 is coupled between the third node Q3 and a ground voltage (Vss) and is configured to discharge the third node Q3 to the ground voltage (Vss) level in response to the potential of the second node Q2.

The selection line control unit 150 includes NMOS transistors NM12 and NM13. The NMOS transistor NM12 is coupled between a selection ground terminal SELGND and the drain selection line DSL of a memory cell block. The NMOS transistor NM12 is configured to couple the drain selection line DSL and the selection ground terminal SELGND together in response to the potential of the second node Q2, and to apply a ground voltage to the drain selection line DSL. The NMOS transistor NM13 is coupled between the selection ground terminal SELGND and the source selection line SSL of the memory cell block. The NMOS transistor NM13 is configured to couple the source selection line SSL and the selection ground terminal SELGND together in response to the potential of the second node Q2, and to apply the ground voltage to the source selection line SSL. When a device operates, the selection ground terminal SELGND preferably is supplied with the ground voltage.

Figure 4:
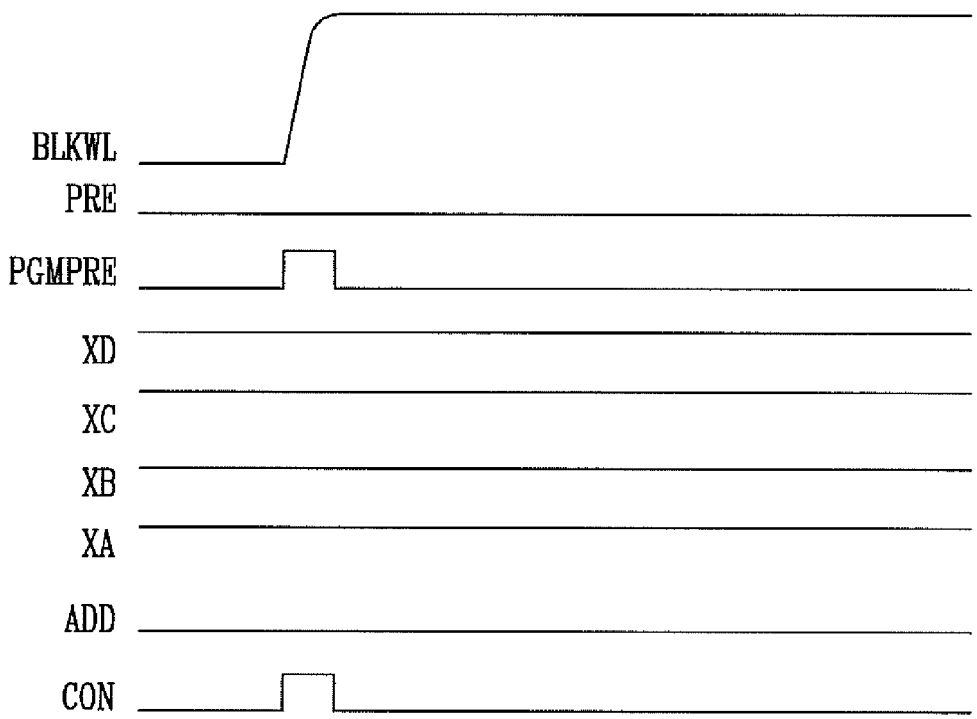
FIG. 4 shows waveforms of operation signals for controlling a selected memory block of the block decoder according to an embodiment of this disclosure.

FIG. 4 shows waveforms of operation signals for controlling a selected memory block of the block decoder according to an embodiment of this disclosure.

The operation of the block decoder configured to control a selected memory block is described below with reference to FIGS. 3 and 4.

When the pre-decoded address signals XD, XC, XB, and XA of a high level are applied to the decoding unit 110, all the NMOS transistors NM1 to NM4 are turned on. Accordingly, the first node Q1 is discharged to a low level, and so the decoding signal ADD of a low level is outputted.

When the address signals XC and XB of a high level and the program precharge signal PGMPRE of a high level are applied to the discharge control unit 120, the NAND gate ND outputs the output signal of a low level. Here, the program precharge signal PGMPRE is applied at a high level only during a precharge period. The inverter IV1 inverts the output signal of the NAND gate ND and outputs the control signal CON of a high level. The NMOS transistor NM5 maintains the second node Q2, which receives the decoding signal ADD, at a low level in response to the control signal CON of a high level. The inverter IV2 inverts the potential of the second node Q2 of a low level and outputs the output signal of a high level to the selection signal generation unit 130.

The selection signal generation unit 130 precharges the third node Q3 with the pumping voltage (Vpp) in response to the first and second high voltage address signals GC and GB respectively corresponding to the address signals XC and XB of a high level.

The discharge unit 140 is disabled by the second node Q2 of a low level.

Next, when a program operation and a read operation start, the program precharge signal PGMPRE shifts to a low level. Then, in response to the decoding signal ADD of a low level, the discharge unit 140 continues to maintain the disable state, and the selection signal generation unit 130 outputs the block selection signal BLKWL of a high level.

Figure 5:
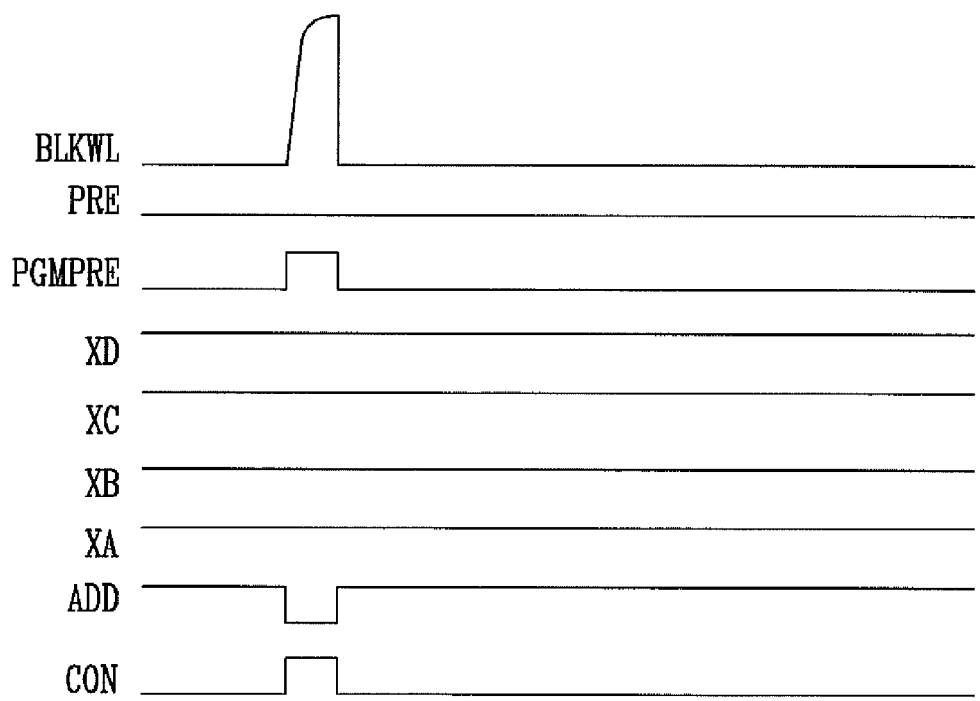
FIG. 5 shows waveforms of operation signals for controlling an unselected memory block of the block decoder according to an embodiment of this disclosure.

FIG. 5 shows waveforms of operation signals for controlling an unselected memory block of the block decoder according to an embodiment of this disclosure.

The operation of the block decoder configured to control an unselected memory block is described below with reference to FIGS. 3 and 5.

First, the pre-decoded address signals XD, XC, XB, and XA are applied to the decoding unit 110. Here, at least any one (preferably, the signal XA) of the address signals XD, XC, XB, and XA is applied at a low level. The address signals applied at a low level preferably are not signals corresponding to the first and second high voltage signals GC and GB applied to the selection signal generation unit 130. In response to the signals of a low level, some (e.g., the transistor NM4) of the NMOS transistors NM1 to NM4 are turned off. Accordingly, the first node Q1 maintains a high level, and so the decoding signal ADD of a high level is outputted.

When the address signals XC and XB of a high level and the program precharge signal PGMPRE of a high level are applied to the discharge control unit 120 during a precharge period, the NAND gate ND outputs an output signal of a low level. The inverter IV1 inverts the output signal of the NAND gate ND and outputs the control signal CON of a high level.

The NMOS transistor NM5 discharges the second node Q2, which receives the decoding signal ADD to a low level for a certain period of time in response to the control signal CON of a high level. Accordingly, the discharge unit 140 is disabled for a certain period of time (i.e., a precharge period) by the second node Q2 of a low level.

The selection signal generation unit 130 precharges the third node Q3 with the pumping voltage (Vpp) in response to the first and second high voltage address signals GC and GB respectively corresponding to the address signals XC and XB of a high level.

Next, during a program operation or read operation period subsequent to the precharge period, when the program precharge signal PGMPRE shifts from a high level to a low level, the control signal CON shifts from a high level to a low level. Accordingly, the potential of the second node Q2 shifts from a low level to a high level, and therefore, the discharge unit 140 is enabled. Consequently, the block selection signal BLKWL to control the unselected memory block is disabled at a low level.

The selection line control unit 150 is enabled in response to the potential of the second node Q2 of a high level, which couples the selection ground terminal SELGND with the source selection line SSL and the drain selection line DSL of the unselected memory block. That is, the selection line control unit 150 turns off the source select transistor and the drain select transistor of the unselected memory block by applying the ground voltage to the source selection line SSL and the drain selection line DSL. Accordingly, charges are prevented from flowing into the channel of the unselected memory block.

As described above, the control signal CON is generated in response to not only the program precharge signal PGMPRE, but the address signals XC and XB respectively corresponding to the first and second high voltage address signals GC and GB. Thus, although the program precharge signal PGMPRE is applied at a high level during a precharge period, the selection line control unit 150 is not disabled unless the address signals XC and XB are enabled. Accordingly, the selection line control unit 150 is controlled such that only 32 memory blocks corresponding to the address signals XC and XB are disabled and the remaining memory blocks are enabled.

According to the embodiment of this disclosure, the selection line control unit 150 configured to apply the ground voltage to the source selection line and the drain selection line of a memory block is controlled in response to the program precharge signal and the address signals. Accordingly, the selection line control unit 150, corresponding to an unselected memory block, is capable of preventing the source selection line and the drain selection line of the unselected memory block from becoming a floating state. Accordingly, a bias drop phenomenon that is generated because a bias of a global word line flows into the word line of an unselected memory block can be prohibited, and so the failure of a program operation for a selected memory block can be prevented.

What is claimed is:
1. A block decoder of a flash memory device, comprising:
a discharge control unit configured to output a discharge signal in response to a program precharge signal and one or more of a number of address signals; and
a selection line control unit configured to apply a ground voltage to source and drain selection lines of memory blocks in response to the discharge signal, wherein the discharge control unit is configured to disable the selection line control unit during a precharge period when the one or more of the address signals are enabled.

2. The block decoder of claim 1, wherein the discharge control unit is configured to enable the selection line control unit during a program or verification operation period.

3. The block decoder of claim 2, wherein the selection line control unit comprises a selection line control unit configured to apply the ground voltage to the source and drain selection lines of unselected memory blocks of the memory blocks during the program or verification operation period.

4. The block decoder of claim 1, further comprising a decoding unit configured to output a decoding signal to the discharge control unit in response to the number of the address signals.

5. The block decoder of claim 4, further comprising:
a selection signal generation unit configured to output a block selection signal in response to one or more high voltage address signals respectively corresponding to the one or more address signals; and
a discharge unit configured to discharge an output terminal of the selection signal generation unit.

6. The block decoder of claim 1, wherein the discharge control unit comprises:
a control signal generation unit configured to generate a control signal in response to the program precharge signal and the one or more address signals; and
a discharge signal generation unit configured to generate the discharge signal in response to the control signal.

7. The block decoder of claim 4, wherein the decoding unit comprises:
a power source supply unit configured to apply a power source voltage to a first node; and
a decoding signal output unit configured to change a potential of the first node in response to the number of the address signals and to output the decoding signal.

8. The block decoder of claim 5, wherein the discharge unit is configured to control the block selection signal in response to the decoding signal or the discharge signal.

9. A block decoder of a flash memory device, comprising:
a decoding unit configured to output a decoding signal to a first node in response to a number of address signals;
a discharge control unit configured to output a discharge signal to the first node in response to a program precharge signal and one or more of the address signals;
a selection signal generation unit configured to output a block selection signal to a second node in response to one or more high voltage address signals respectively corresponding to the one or more address signals;
a discharge unit configured to discharge a potential of the second node in response to the decoding signal or the discharge signal applied to the first node; and
a selection line control unit configured to apply a ground voltage to source and drain selection lines of a memory block in response to the decoding signal or the discharge signal applied to the first node.

10. The block decoder of claim 9, wherein the discharge control unit is configured to disable the selection line control unit during a precharge period when the one or more of the address signals are enabled and to enable the selection line control unit during a program or verification operation period.

11. The block decoder of claim 10, wherein the selection line control unit is configured to apply a ground voltage to source and drain selection lines of unselected memory blocks of the memory blocks during the program or verification operation period.

* * * * *